United States Patent
Nishibe et al.

(12)

(10) Patent No.: US 6,713,331 B2
(45) Date of Patent: Mar. 30, 2004

(54) SEMICONDUCTOR DEVICE MANUFACTURING USING ONE ELEMENT SEPARATION FILM

(75) Inventors: Eiji Nishibe, Gunma (JP); Shuichi Kikuchi, Gunma (JP); Takuya Suzuki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 232 days.

(21) Appl. No.: 09/944,452

(22) Filed: Aug. 31, 2001

(65) Prior Publication Data

US 2002/0050618 A1 May 2, 2002

(30) Foreign Application Priority Data

Oct. 19, 2000 (JP) .................................. P2000-318805
Oct. 19, 2000 (JP) .................................. P2000-318807

(51) Int. Cl.[7] ............................................. H01L 21/336
(52) U.S. Cl. ..................... 438/197; 438/234; 438/527
(58) Field of Search ............................... 438/197, 234, 438/527, 204, 316, 335; 257/347, 487, 409, 350

(56) References Cited

U.S. PATENT DOCUMENTS

| | | | | | |
|---|---|---|---|---|---|
| 5,412,241 | A | * | 5/1995 | Merchant | 257/409 |
| 5,592,014 | A | * | 1/1997 | Funaki et al. | 257/487 |
| 5,640,040 | A | * | 6/1997 | Nakagawa et al. | 257/487 |
| 6,118,152 | A | * | 9/2000 | Yamaguchi et al. | 257/347 |
| 6,127,703 | A | * | 10/2000 | Letavic et al. | 257/347 |
| 6,191,453 | B1 | * | 2/2001 | Petruzzello et al. | 257/350 |

* cited by examiner

*Primary Examiner*—W. David Coleman
(74) *Attorney, Agent, or Firm*—Fish & Richardson P.C.

(57) ABSTRACT

A semiconductor device is provided with a gate electrode formed over a substrate that has gate oxide films disposed thereon. Source-drain regions of low and high concentration are formed next to the gate electrode. A diffusion region width of the source side of the source-drain regions is smaller than at least a diffusion region width of the drain side.

6 Claims, 5 Drawing Sheets

— PRIOR ART —

SEMICONDUCTOR DEVICE MANUFACTURING USING ONE ELEMENT SEPARATION FILM

BACKGROUND OF THE INVENTION

1. Field of the Invention

The present invention relates to a semiconductor device and manufacturing method thereof. More particularly, the present invention relates to a technique for improving a withstanding voltage of operation of a semiconductor device while the drive capacity of the semiconductor device is being prevented from deteriorating.

2. Description of the Related Art

Figure 10:
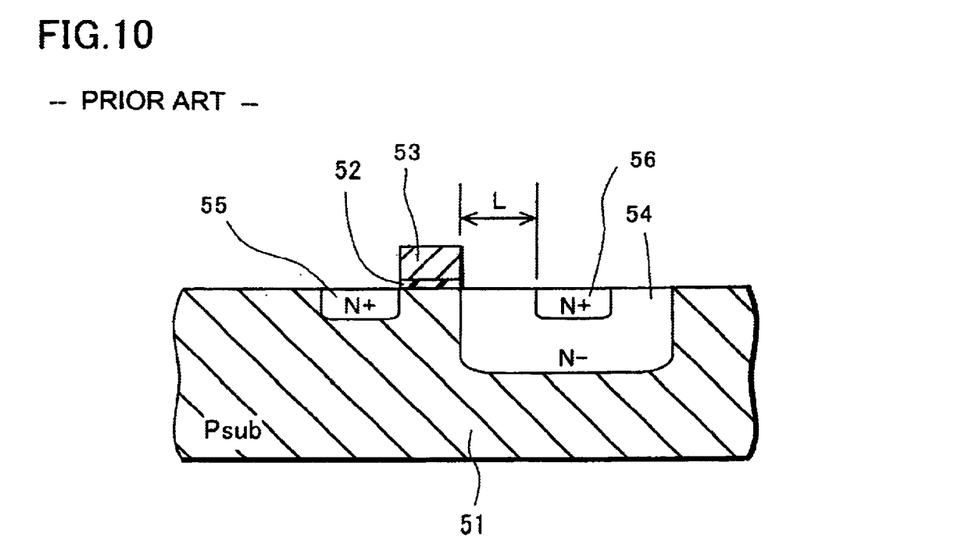
FIG. 10 is a cross-sectional view showing a conventional semiconductor device.

FIG. 10 is a cross-sectional view for explaining a conventional semiconductor device.

In FIG. 10, reference numeral 51 is a first conductive type semiconductor substrate, for example, reference numeral 51 is a P type semiconductor substrate. On the substrate 51, the gate electrode 53 is formed via the gate oxide film 52. Source drain regions of one side LDD (Lightly Doped Drain) structure are formed adjacent to the gate electrode 53. That is, on the source region side, the source region 55 of high concentration (N+ type) is formed adjacent to the gate electrode 53. On the drain region side, the drain region 54 of low concentration (N− type) is formed adjacent to the gate electrode 53, and the drain region 56 of high concentration (N+ type) is formed in the drain region 54 of low concentration. The conventional semiconductor device has the source and the drain region of one side LDD structure composed in the manner described above.

In the above semiconductor device of one side LDD structure in which a high voltage is impressed only upon the drain region side, in order to prevent an electric field from concentrating upon the drain region side, it is composed in such a manner that the drain region 56 of high concentration is surrounded by the drain region 54 of low concentration and only the source region 55 of high concentration is formed on the source region side in which a high withstanding voltage is unnecessary.

Even in the semiconductor device of the above structure, no problems are caused with respect to the static withstanding voltage. However, in the case of operation, the following problems are caused in the semiconductor device of the above structure.

The problems are described as follows. In the bipolar structure composed of a source region (emitter region), substrate (base region) and drain region (collector region), since the source region 55 of high concentration is exposed from the emitter region, the injection efficiency of carrier is high, so that the bipolar transistor is easily turned on by a low intensity of substrate electric current (I sub).

That is, since electric current gain $\beta$ is high in the bipolar transistor, the withstanding voltage of drain is lowered at the operation time compared with the semiconductor device of both side LDD structure.

In this case, if a commonly used both side LDD structure is adopted, electric current gain $\beta$ is lowered and it is sure that the withstanding voltage is enhanced. However, although high withstanding voltage is originally unnecessary on the source side, the common LDD structure is adopted on the source side, too. Therefore, the source side necessarily has the same length (L) of the drift region as that on the drain side. Accordingly, ON-resistance is increased and the drive capacity is lowered.

SUMMARY OF THE INVENTION

In order to solve the above problems, the first aspect of the present invention provides a semiconductor device comprising: a gate electrode formed on a first conductive type semiconductor substrate via the first and the second gate oxide film; and second conductive type source•drain regions of low and high concentration formed adjacent to the gate electrode, wherein a diffusion region width of the source•drain regions of low concentration on the source region side is smaller than at least that on the drain region side, and the semiconductor device further comprising a source region of high concentration formed adjacent to one end of the gate electrode; and a drain region of high concentration formed at a position distant from the other end of the gate electrode by a predetermined interval.

The first aspect of the present invention provides a method of manufacturing a semiconductor device comprising the steps of: forming a first photo resist film having a first opening in a source forming region on a first conductive type semiconductor substrate and also having a second opening, the size of which is larger than that of the first opening, in a drain forming region; forming second conductive type source•drain regions of low concentration when a second conductive type first impurity is subjected to ion implantation into the substrate by using the first photo resist film as a mask and then the impurity is diffused; forming a element separation film in a predetermined region by selectively oxidizing while an oxidation-resistant film formed on the substrate is being used as a mask and also forming a second gate oxidation film in regions except for the element separation film and the first gate oxidation film; forming a gate electrode in such a manner that the gate electrode lies across the first and the second gate oxidation film; forming a second photo resist film having a third opening in the source region of low concentration and also having fourth opening in a region separate from the other end portion of the gate electrode in the drain region of low concentration; and forming second conductive type source•drain regions of high concentration when ions of a second conductive type second impurity are implanted into the substrate by using the second photo resist film, gate electrode, element separation film and first gate oxidation film as a mask.

Further, the present invention provides a method of manufacturing a semiconductor device, wherein the step of forming the source-drain regions of low concentration is composed of implantation and diffusion of ions of the first impurity made of phosphorous ions, and the step of forming the source-drain regions of high concentration is composed of implantation of ions of second impurity made of arsenic ions.

Due to the foregoing, it is possible to form a source region of high concentration in the source region of low concentration so that said source region of high concentration is very close to the outer boundary of said source region of low concentration. Therefore, as compared with a structure in which the region of high concentration is formed in the region of low concentration such as an LDD structure under the condition that the drift region is separate by a distance, it is possible to enhance the withstanding voltage of drain in the case of operation while the drive capacity is being prevented from deteriorating.

The second aspect of the present invention provides a semiconductor device comprising: a gate electrode formed on a first conductive type semiconductor substrate via the first and the second gate oxide film; second conductive type source drain regions of low and high concentration formed adjacent to the gate electrode; and a first conductive type region of low concentration and a first conductive type region of high concentration formed adjacent to the source region of low concentration and the source region of high concentration.

Also, the present invention provides a method of manufacturing a semiconductor device comprising the steps of: forming a first photo resist film having an opening in the source•drain forming regions on the first conductive type semiconductor substrate and also forming a first impurity implantation region by implanting the second conductive type first impurity into the substrate while the photo resist film is being used as a mask; forming a second photo resist film having an opening in the neighborhood of the source forming region on the substrate and also forming a second impurity implantation region by implanting the first conductive type second impurity ions into the substrate while the photo resist film is being used as a mask; forming second conductive type source•drain regions of low concentration by diffusing the first and the second impurity and also forming a first conductive type region of low concentration adjacent to the source region of low concentration; forming a element separation film in a predetermined region by selectively oxidizing while the oxidation resistance film formed on the substrate is being used as a mask and also forming a second gate oxidation film in regions except for the element separation film and the first gate oxidation film after the first gate oxidation film has been formed; forming a gate electrode in such a manner that the gate electrode lies across the first gate oxidation film and the second gate oxidation film; forming a third photo resist film having an opening in the source•drain forming regions of high concentration on the substrate; forming a second conductive type source region of high concentration in the source region of low concentration so that said source region of high concentration is very close to the outer boundary of said source region of low concentration and is adjacent to one end portion of the gate electrode when ions of a second conductive type third impurity are implanted into the substrate by using the third photo resist film, gate electrode, element separation film and first gate oxidation film as a mask and also forming a second conductive type drain region of high concentration in a region separate from the other end portion of the gate electrode; and forming a one-conductive region of high concentration in the region of low concentration when the first conductive type fourth impurity is subjected to ion implantation into the substrate while the fourth photo resist film is being used as a mask after the fourth photo resist film having an opening has been formed on the first conductive type region of low concentration.

Also, the present invention provides a method of manufacturing a semiconductor device, wherein the step of forming the second conductive type source drain region of low concentration and the step of forming the first conductive type region of low concentration are composed of simultaneous diffusion of the first and the second impurity, the conductive types of which are different, implanted into the substrate in the same diffusion step.

Due to the foregoing, the following effects can be provided. When the first conductive type region of high concentration is formed so that it can be adjacent to the second conductive type source region of high concentration, it becomes possible to more strongly fix the electric potential in the neighborhood of the source region, and it becomes possible to prevent the occurrence of a bipolar operation caused by the substrate electric current. Further, when the second conductive type source region of low concentration and the first conductive type region of low concentration are formed so that the second conductive type source region of high concentration and the first conductive type region of high concentration can be respectively surrounded and also when diffusion depth Xj is made equal to each other, it is possible to suppress an increase in the electric potential in the neighborhood of the source region even in a relatively deep portion of the substrate, and the electric potential can be fixed more stably.

DESCRIPTION OF THE PREFERRED EMBODIMENTS

Referring to the accompanying drawings, the first embodiment of the semiconductor device of the first present invention will be explained below and also an embodiment of the method of manufacturing the semiconductor device will be explained below.

Figure 4:
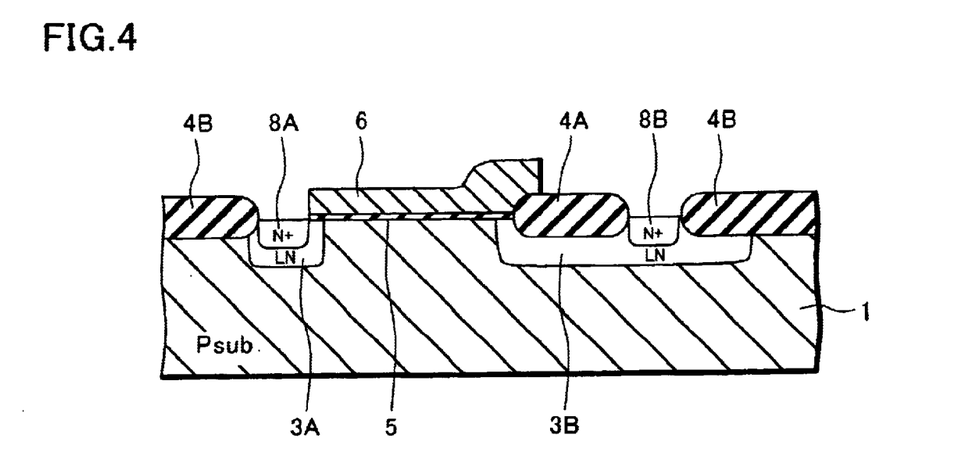
FIG. 4 is a cross-sectional view showing a method of manufacturing a semiconductor device of the first embodiment of the present invention.

As shown in FIG. 4, in the semiconductor device of the present invention, there is provided a gate electrode 6 on the first conductive type semiconductor substrate 1, P type for example, in such a manner that the gate electrode 6 lies across the first gate oxide film 4A and the second gate oxide film 5. There is provided an LN type source region 3A of low concentration so that the source region 3A can be adjacent to one end of the gate electrode 6 (one end portion of the first gate oxide film 4A), and also there is provided an N+ type source region 8A of high concentration in the source region 3A so that said source region 8A is very close to the outer boundary of said source region 3A. There is provided an LN type drain region 3B of low concentration so that the drain region 3B can be adjacent to the other end of the gate electrode 6 (the other end of the first gate oxide film 4A).

There is provided an N+ type drain region 8B of high concentration so that the drain region 8B can be adjacent to one end portion of the first gate oxide film 4A in the drain region 3B of low concentration.

As described above, the semiconductor device of the present invention is characterized in that the diffusion region widths of the source drain regions 3A, 3B of low concentration are formed in such a manner that the width of the diffusion region in the source drain region on the source side is smaller than at least that on the drain side and also characterized in that the source region 8A of high concentration is in the source region 3A of low concentration so that said source region 8A is very close to the outer boundary of said source region 3A.

When the above structure is adopted, the following effects can be provided. As compared with the conventional semiconductor device of LDD structure having a source and a drain region of low concentration which are substantially symmetrical to each other, the semiconductor device of this structure has no drift region. Therefore, it is possible to decrease only electric gain β while the decrease in the drive capacity is being suppressed. Accordingly, it is possible to enhance the withstanding voltage of drain in the case of operation.

Referring to the accompanying drawings, a method of manufacturing the above semiconductor device will be explained as follows.

Figure 1:
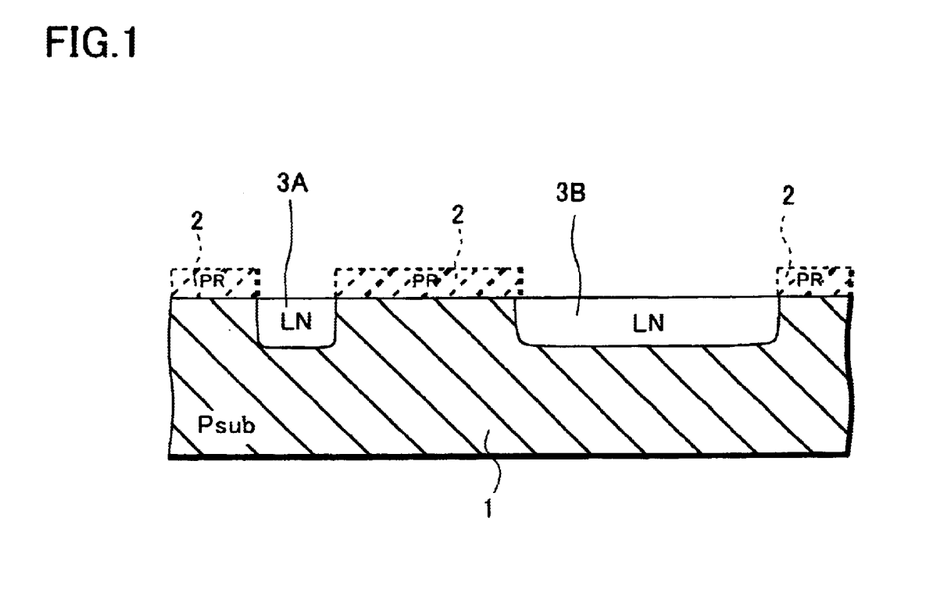
FIG. 1 is a cross-sectional view showing a method of manufacturing a semiconductor device of the first embodiment of the present invention.

First, in FIG. 1, N type impurity is subjected to ion-implantation while the photo resist film (PR) 2 formed on the P type semiconductor substrate 1 is used as a mask. After the photo resist film 2 has been removed, the above impurity is thermally diffused so as to form the N type (LN type) source region 3A and the drain region 3B. Here, as shown in FIG. 1, the photo resist film 2 is formed in such a manner that the opening width of the photo resist film 2 on the source forming region side is smaller than that on the drain forming region side. Using forementioned photo resist film 2 as a mask, phosphorous ions have been implanted at the acceleration voltage of about 100 KeV by the dose of about $6 \times 10^{12}/cm^2$. After the completion of ion implantation, heat diffusion treatment is conducted at 100° C. for 4 hours.

Figure 2:
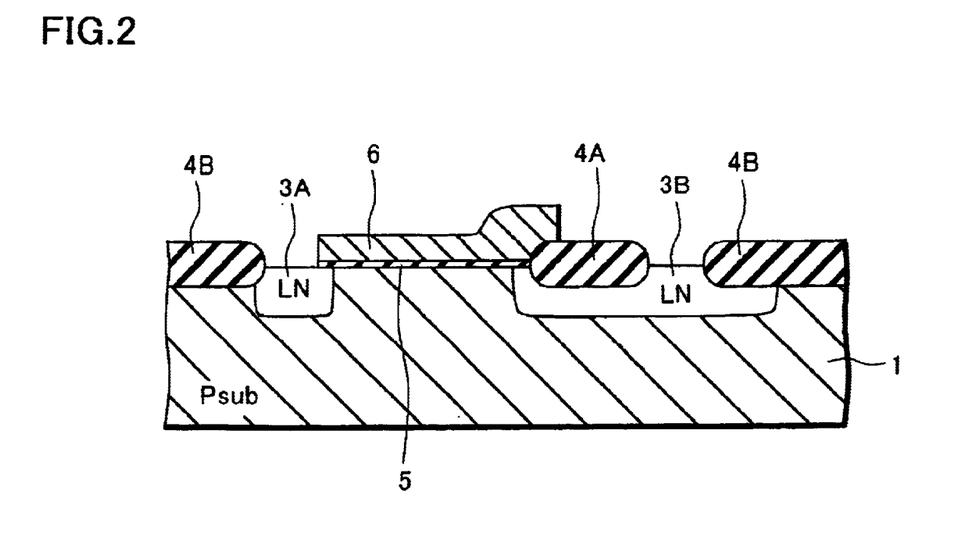
FIG. 2 is a cross-sectional view showing a method of manufacturing a semiconductor device of the first embodiment of the present invention.

Next, in FIG. 2, a pad oxide film not shown is formed on the substrate 1, and a silicon nitride film, which is used as an oxidation-resistant film, having openings in predetermined regions (the first gate oxidation film forming region and element separation film forming region) is formed. After that, the silicon nitride film is used as a mask and a selective oxidation is conducted by the well known LOCOS method so as to form the first gate oxidation film 4A, the thickness of which is about 1000 nm, and also to form the element separation film 4B. Further, after the pad oxidation film and the silicon nitride film have been removed, a portion on the substrate 1 in which the first gate oxidation film 4A and the element separation film 4B are not formed is thermally oxidized so as to form the second gate oxidation film 5, the thickness of which is about 150 nm. Then, a polysilicon film, the thickness of which is about 400 nm, is formed on the substrate 1. After the polysilicon film has been subjected to conductive treatment, patterning is conducted while a photo resist film not shown is being used as a mask, so that the gate electrode 6 is formed in such a manner that the gate electrode 6 lies across the first gate oxidation film 4A and the second gate oxidation film 5. At this time, the second gate oxide film 5 on the substrate 1 except for the region where the gate electrode 6 is formed on is removed.

Figure 3:
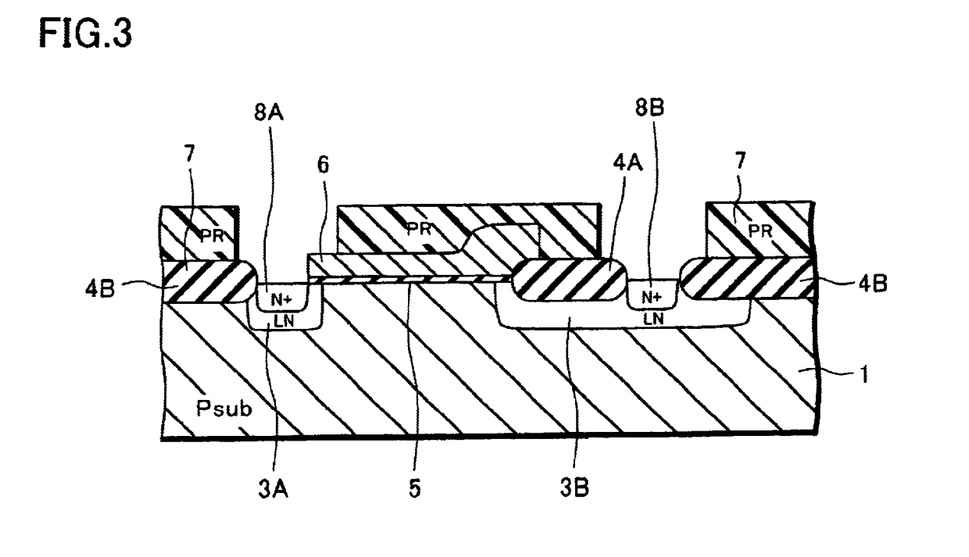
FIG. 3 is a cross-sectional view showing a method of manufacturing a semiconductor device of the first embodiment of the present invention.

Further, in FIG. 3, while the photo resist film 7 formed on the substrate 1 is being used as a mask, ions of N type impurity are implanted so that the impurity can be adjacent to one end portion of the gate electrode 6, and ions of N type impurity are implanted so that the impurity can be separate from the other end portion of the gate electrode 6 and also the impurity can be adjacent to one end portion of the first gate oxide film 4A, so as to form the N+ type source region 8A of high concentration in the source region 3A of low concentration so that said source region 8A is very close to the outer boundary of said source region 3A, and at the same time the N+ type drain region 8B of high concentration is formed so that the drain region 8B can be adjacent to one end portion of the first gate oxide film 4A in the drain region 3B of low concentration. In this case, ions of arsenic are implanted at the acceleration voltage of about 80 KeV by the dose of $6 \times 10^{15}/cm^2$.

FIG. 4 is a view showing a semiconductor device from which the photo resist film 7 has been removed. Although explanations in which the drawings are referred are omitted here, an interlayer insulating film is formed all over the surface, and then a contact hole is formed on the interlayer insulating film so that the contact hole can come into contact with the source drain regions. After that, the source•drain electrodes are formed via the contact hole.

As described above, according to the manufacturing method of the present invention, the source region 8A of high concentration can be formed (without having the drift region distance (L) shown in FIG. 10) in the source region 3A of low concentration formed on the surface layer of the substrate 1 so that said source region 8A is very close to the outer boundary of said source region 3A. Therefore, it is possible to suppress the occurrence of a problem in which the drive capacity is lowered (the ON-resistance is increased) due to the drift region distance (L) which tends to occur in the conventional semiconductor device of both side LDD structure, and only the electric current gain β can be decreased. Accordingly, the withstanding voltage of drain can be enhanced in the case of operation.

By matching placements of the edge of opening portion of photo resist film 2 (shown in FIG. 1) and one end of gate electrode 6 (shown in FIG. 3), further utilizing the difference of the diffusion coefficients of LN dope (phosphorus) and N+ dope (arsenic), it is possible to form a N+ type source region 8A in a source region 3A of low concentration so that said source region 8A is very close to the outer boundary of said source region 3A.

In this connection, this embodiment discloses an example in which the present invention is applied to an N-channel type MOS transistor, however, it is possible to apply the present invention to a P-channel type MOS transistor.

Referring to the accompanying drawings, the second embodiment of the semiconductor device of the present invention will be explained below and also an embodiment of the method of manufacturing the semiconductor device will be explained below.

Figure 9:
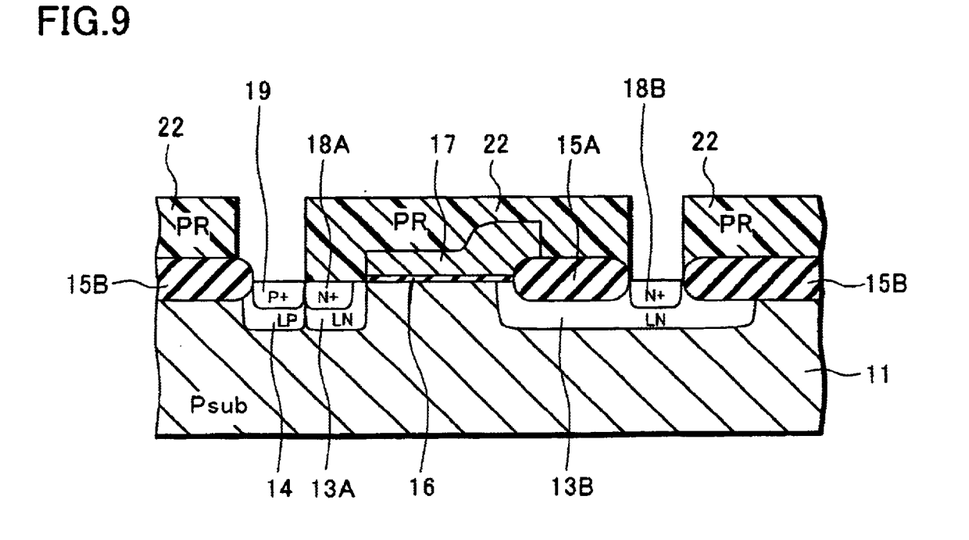
FIG. 9 is a cross-sectional view showing a method of manufacturing a semiconductor device of the second embodiment of the present invention.

As shown in FIG. 9, in the semiconductor device of the present invention, the gate electrode 17 is formed on a first conductive type semiconductor substrate, for example, on a P type semiconductor substrate 11 in such a manner that the gate electrode 17 lies across the first gate oxide film and the second gate oxide film 16. There is provided an LN type source region 13A of low concentration so that the source region 13A can be adjacent to one end of the gate electrode 17 (one end portion of the second gate oxide film 16), and also there is provided an N+ type source region 18A of high concentration in the source region 13A so that said source region 18A is very close to the outer boundary of said source region 13A. There is provided an LN type drain region 13B of low concentration so that the drain region 13B can be adjacent to the other end of the gate electrode 17 (the other end of the second gate oxide film 16). There is provided an N+ type drain region 18B of high concentration so that the drain region 18B can be adjacent to one end portion of the first gate oxide film 15A in the drain region 13B of low concentration. The first conductive type (LP type) region 14 of low concentration is formed in such a manner that the region 14 can be adjacent to the source region 13A of low concentration, and the first conductive type (P+ type) region 19 of high concentration is formed in such a manner that the region 19 can be adjacent to the source region 18A of high concentration, which is the feature of the present invention.

When the above structure is adopted, the following effects can be provided. As compared with the conventional semiconductor device of LDD structure having a source and a drain region of low concentration which are substantially symmetrical to each other, the semiconductor device of this structure has no drift region. Therefore, it is possible to decrease only electric gain β while the decrease in the drive capacity is being suppressed. Accordingly, it is possible to enhance the withstanding voltage of drain in the case of operation.

When the first conductive type (P+ type) region 19 of high concentration is formed so that it can be adjacent to the N+ type source region 18A of high concentration, it becomes possible to strongly fix the electric potential in the neighborhood of the source region, and it becomes possible to prevent the occurrence of a bipolar operation caused by the substrate electric current.

Further, when the LN type source region 13A of low concentration and the first conductive type (LP type) region 14 of low concentration are formed so that the N+ type source region 18A of high concentration and the first conductive type (P+ type) region 19 of high concentration can be respectively surrounded, and also when diffusion depth Xj is made equal to each other because the same heat treatment is conducted as described later, it is possible to suppress an increase in the electric potential in the neighborhood of the source region even in a relatively deep portion of the substrate, and the electric potential can be fixed more stably.

Referring to the accompanying drawings, a method of manufacturing the above semiconductor device will be explained as follows.

Figure 5:
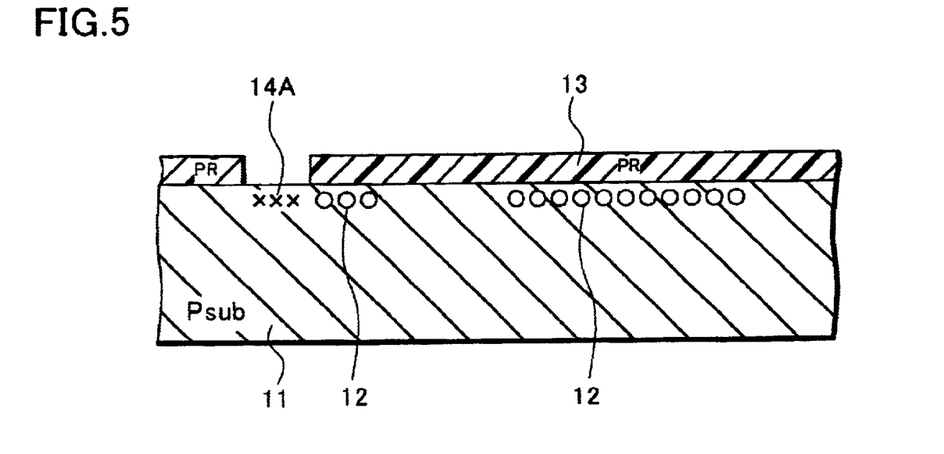
FIG. 5 is a cross-sectional view showing a method of manufacturing a semiconductor device of the second embodiment of the present invention.

First, in FIG. 5, the photo resist film formed on the P type semiconductor substrate 11 is used as a mask, and ions of impurity are implanted so as to form an impurity implantation region. In this connection, in FIG. 5, a photo resist film not shown, in which the opening width on the source forming region side is smaller than at least that on the drain forming region side, is used as a mask, and phosphorous ions are implanted at the acceleration voltage of about 100 KeV by the dose of about $6 \times 10^{12}/cm^2$ so as to form the first impurity implanting region 12. FIG. 5 shows a process of forming the second impurity implanting region 14A after that. After the first impurity implanting region 12 has been formed, while the photo resist film (PR) 13 having an opening at a region where the second impurity implanting region is to be formed is used as a mask, boron ions are implanted at the acceleration voltage of about 80 KeV by the dose of about $1.9 \times 10^{13}/cm^2$ so as to form the second impurity implanting region 14A. FIG. 5 shows these circumstances.

Figure 6:
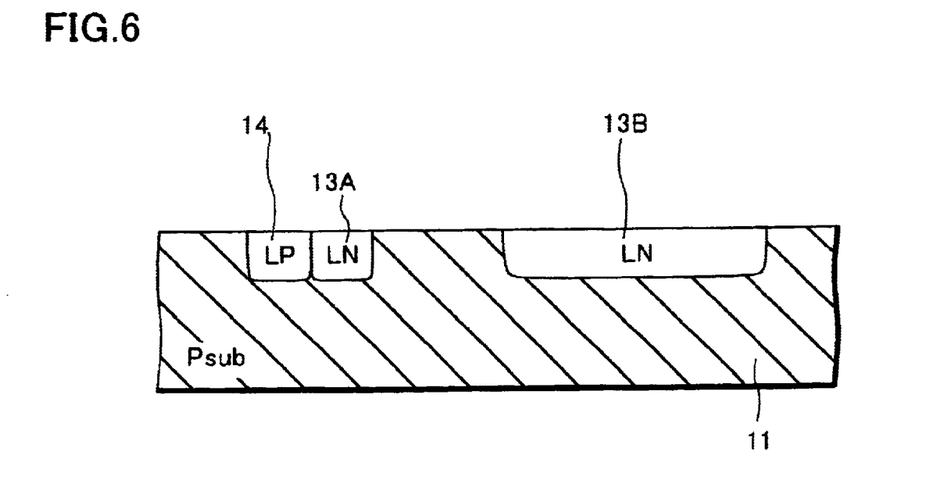
FIG. 6 is a cross-sectional view showing a method of manufacturing a semiconductor device of the second embodiment of the present invention.

Successively, in FIG. 6, after the photo resist film (PR) 13 has been removed, the phosphorous and the boron ions are thermally diffused so as to form an LN type source region 13A and an LN type drain region 13B of low concentration. At the same time, a first conductive type (LP type) region of low concentration (P type region of low concentration) 14 is formed so that it can be adjacent to the LN type source region 13A of low concentration. In this case, since the same heat treatment is conducted, the source region 13A of low concentration (LN type) and the first conductive type (LP type) region of low concentration 14 are formed as the diffusing depth Xj for each is similarly deep with each other. In this connection, at this time, heat treatment is conducted at 1100° C. for 4 hours.

Figure 7:
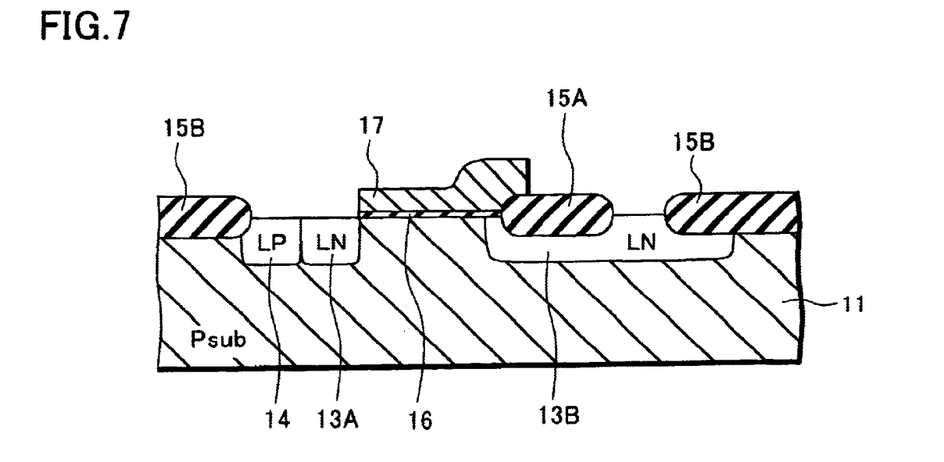
FIG. 7 is a cross-sectional view showing a method of manufacturing a semiconductor device of the second embodiment of the present invention.

Next, in FIG. 7, after a pad oxide film not shown and a silicon nitride film, which is an oxidation-resistant film having an opening in the predetermined regions (the first gate oxide film forming region and the element separation film forming region), have been formed on the substrate 11, a selective oxidation is conducted by the well known LOCOS method while the silicon nitride film is being used as a mask, so that the first gate oxide film 15A, the thickness of which is about 1000 nm, and the element separation film 15B are respectively formed. Further, after the pad oxidation film and the silicon nitride film have been removed, a portion on the substrate 11 in which the first gate oxidation film 15A and the element separation film 15B are not formed is thermally oxidized so as to form the second gate oxidation film 16, the thickness of which is about 150 nm. Then, a polysilicon film, the thickness of which is about 400 nm, is formed on the substrate 11. After the polysilicon film has been subjected to conductive treatment, patterning is conducted while a photo resist film not shown is being used as a mask, so that the gate electrode 17 is formed in such a manner that the gate electrode 17 lies across the first gate oxidation film 15A and the second gate oxidation film 16. At this time, the second gate oxide film 16 on the substrate 11 except for the second gate oxide film 16, on which the gate electrode 17 is formed, is removed.

Figure 8:
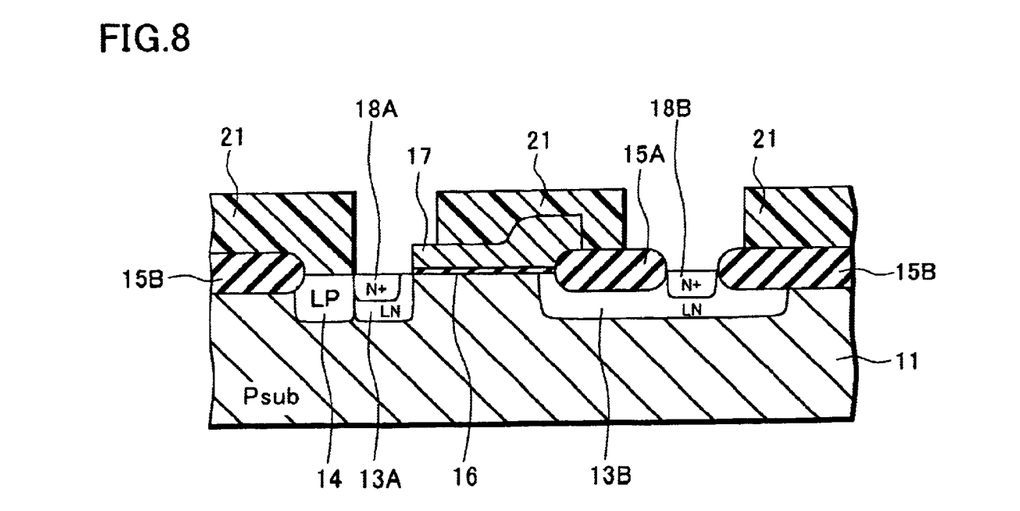
FIG. 8 is a cross-sectional view showing a method of manufacturing a semiconductor device of the second embodiment of the present invention.

Further, in FIG. 8, while the photo resist film 21 formed on the substrate 11 is being used as a mask, ions of N type impurity are implanted so that the impurity can be adjacent to one end portion of the gate electrode 17, and ions of N type impurity are implanted so that the impurity can be separate from the other end portion of the gate electrode 17 and also the impurity can be adjacent to one end portion of the first gate oxide film 15A, so as to form the N+ type source region 18A of high concentration in the source region 13A of low concentration so that said source region 18A is very close to the outer boundary of said source region 13A, and at the same time the N+ type drain region 18B of high concentration is formed so that the drain region 18B can be adjacent to one end portion of the first gate oxide film 15A in the drain region 13B of low concentration. In this case, ions of arsenic are implanted at the acceleration voltage of about 80 KeV by the implantation rate of $6 \times 10^{15}/cm^2$.

Further, as shown in FIG. 9, when ions of the P type impurity is implanted so that it can be adjacent to the N+ type source region 18A of high concentration while the photo resist film 22 formed on the substrate 11 is being used as a mask, the first conductive type (P+ type) region of high concentration (the P type region of high concentration) 19 is formed in the first conductive type (LP type) region 14 of low concentration. At this time, ions of boron are implanted at the acceleration voltage of about 30 KeV by the dose of $1.8 \times 10^{15}/cm^2$.

Although explanations in which the drawings are referred are omitted here, an interlayer insulating film is formed all over the surface, and then a contact hole is formed on the interlayer insulating film so that the contact hole can come into contact with the source•drain regions. After that, a source and a drain electrode are formed via the contact hole.

As described above, according to the manufacturing method of the present invention, the source region 18A of high concentration can be formed (without having the drift region distance (L) shown in FIG. 10) in the source region 13A of low concentration formed on the surface layer of the substrate 11 so that said source region 18A is very close to the outer boundary of said source region 13A. Therefore, it is possible to suppress the occurrence of a problem in which the drive capacity is lowered (the ON-resistance is increased) due to the drift region distance (L) which tends to occur in the conventional semiconductor device of both side LDD structure, and only the electric current gain β can be decreased. Accordingly, the withstanding voltage of drain can be enhanced in the case of operation.

Further, when the LN type source region 13A of low concentration and the first conductive type (LP type) region 14 of low concentration are formed so that the N+ type source region 18A of high concentration and the first conductive type (P+ type) region 19 of high concentration can be respectively surrounded, it is possible to suppress an increase in the electric potential in the neighborhood of the source region even in a relatively deep portion of the substrate, and the electric potential can be fixed more stably. Therefore, the bipolar operation caused by the substrate electric current seldom occurs.

Further, even when only the first conductive type (P+ type) region 19 of high concentration is formed so that it can be adjacent to the N+ type source region 18A of high concentration in the semiconductor device of the one side LDD structure, the electric potential in the neighborhood of the source region can be fixed. Therefore, it is possible to make the bipolar operation, which is caused by the substrate electric current, seldom occur.

As explained above, according to the present invention, it is possible to form a source region of high concentration in the source region of low concentration (without having the drift region distance, which is unlike the conventional manner) so that a source region of high concentration is very close to the outer boundary of a source region of low concentration. Therefore, it is possible to suppress the occurrence of a problem in which the drive capacity is lowered due to the drift region distance which tends to occur in the conventional semiconductor device of both side LDD structure, and only the electric current gain β can be decreased. Accordingly, the withstanding voltage of drain can be enhanced in the case of operation.

Further, when the first conductive type region of high concentration is formed so that it can be adjacent to the second conductive type source region of high concentration, the electric potential of the neighborhood of the source region can be fixed. Therefore, it becomes difficult for the bipolar operation to be caused by the substrate electric current. Accordingly, the withstanding voltage of drain can be enhanced in the case of operation.

Furthermore, when the second conductive type source region of low concentration and the first conductive type region of low concentration are formed so that the second conductive type source region of high concentration and the first conductive type region of high concentration can be respectively surrounded, the electric potential in the neighborhood of the source region can be more strongly fixed even in a relatively deep portion of the substrate. Therefore, it becomes possible for the bipolar operation to be seldom caused by the substrate electric current.

What is claimed is:

1. A method of manufacturing a semiconductor device comprising the steps of:

forming a first photo resist film having a first opening in a source forming region on a first conductive type semiconductor substrate and also having a second opening, a size of which is larger than that of the first opening, in a drain forming region;

forming second conductive type source•drain regions of low concentration when a first impurity of the second conductive type is subjected to ion implantation into the substrate by using the first photo resist film as a mask and then the second type first impurity is diffused;

forming an element separation film in a predetermined region by selectively oxidizing while an oxidation-resistant film formed on the substrate is being used as a mask and also forming a first gate oxidation film, further forming a second gate oxidation film in regions except for the element separation film and the first gate oxidation film after the element separation film and the first gate oxidation film having been formed;

forming a gate electrode in such a manner that the gate electrode lies across the first and the second gate oxidation film;

forming a second photo resist film having a third opening in the source region of low concentration and also having fourth opening in a region separate from the other end portion of the gate electrode in the drain region of low concentration; and forming second conductive type source•drain regions of high concentration when ions of a second impurity of the second conductive type are implanted into the substrate by using the second photo resist film, gate electrode, element separation film and first gate oxidation film as a mask.

2. A method of manufacturing a semiconductor device according to claim 1, wherein the step of forming the source•drain regions of low concentration is composed of implantation and diffusion of ions of the first impurity made of phosphorous ions, and the step of forming the source•drain regions of high concentration is composed of implantation of ions of second impurity made of arsenic ions.

3. A method of manufacturing a semiconductor device comprising the steps of:

forming a first photo resist film having an opening in source•drain forming regions on a first conductive type semiconductor substrate and also forming a first impurity implantation region by implanting a first impurity of a second conductive type into the substrate while the photo resist film is being used as a mask;

forming a second photo resist film having an opening in the neighborhood of the source forming region on the substrate and also forming a second impurity implantation region by implanting second impurity ions of the first conductive type into the substrate while the photo resist film is being used as a mask;

forming second conductive type source•drain regions of low concentration by diffusing the first and the second impurity and also forming a first conductive type region of low concentration adjacent to the source region of low concentration;

forming an element separation film in a predetermined region by selectively oxidizing while the oxidation resistance film formed on the substrate is being used as a mask and also forming a second gate oxidation film in regions except for the element separation film and the first gate oxidation film after the first gate oxidation film has been formed;

forming a gate electrode in such a manner that the gate electrode lies across the first gate oxidation film and the second gate oxidation film;

forming a third photo resist film having an opening in the source•drain forming regions of high concentration on the substrate;

forming a second conductive type source region of high concentration in the source region of low concentration so that said source region of high concentration is very close to the outer boundary of said source region of low concentration and is adjacent to one end portion of the gate electrode when ions of a third impurity of a second conductive type are implanted into the substrate by using the third photo resist film, gate electrode, element separation film and first gate oxidation film as a mask and also forming a second conductive type drain region of high concentration in a region separate from the other end portion of the gate electrode; and forming a first-conductive region of high concentration in the region of low concentration when a fourth impurity of the first conductive type is subjected to ion implantation into the substrate while the fourth photo resist film is being used as a mask after the fourth photo resist film having an opening has been formed on the first conductive type region of low concentration.

4. A method of manufacturing a semiconductor device according to claim 3, wherein the step of forming the second conductive type source•drain region of low concentration and the step of forming the first conductive type region of low concentration are composed of simultaneous diffusion of the first and the second impurity, the conductive types of which are different, implanted into the substrate in the same diffusion step.

5. A method of manufacturing a semiconductor device according to claim 3 or 4, wherein the step of forming the second conductive type source•drain regions of low concentration is composed of implantation and diffusion of ions of the first impurity made of phosphorous ions, and the step of forming the first conductive type region of low concentration is composed of implantation and diffusion of ions of the second impurity made of boron ions.

6. A method of manufacturing a semiconductor device according to claim 3, wherein the step of forming the second conductive type source•drain regions of low concentration is composed of implantation and diffusion of ions of the first impurity made of phosphorous ions, the step of forming the source•drain regions of high concentration is composed of implantation of ions of the third impurity made of arsenic ions, and the step of forming the first conductive type region of high concentration is composed of implantation of ions of the fourth impurity made of boron hydrogendifluoride.

* * * * *